United States Patent
Persico et al.

(10) Patent No.: US 7,130,599 B2
(45) Date of Patent: Oct. 31, 2006

(54) QUADRATURE GENERATOR WITH IMAGE REJECT MIXER

(75) Inventors: Charles J. Persico, Rancho Santa Fe, CA (US); James Jaffee, Solana Beach, CA (US); Steven C. Ciccarelli, Encinitas, CA (US)

(73) Assignee: Qualcomm Inc., San Diego, CA (US)

(*) Notice: Subject to any disclaimer, the term of this patent is extended or adjusted under 35 U.S.C. 154(b) by 380 days.

(21) Appl. No.: 09/798,378

(22) Filed: Mar. 2, 2001

(65) Prior Publication Data

US 2002/0055337 A1    May 9, 2002

Related U.S. Application Data

(60) Provisional application No. 60/245,230, filed on Nov. 3, 2000.

(51) Int. Cl.
    *H03J 7/32* (2006.01)
(52) U.S. Cl. ............... 455/147; 455/209; 455/255; 455/313; 455/318; 331/22; 331/34
(58) Field of Classification Search ............... 455/112, 455/47, 109, 203, 333, 327, 118, 306, 307, 455/550.1, 575.1, 146, 190, 173.1, 182.1, 455/186.1, 515, 67.11, 67.13, 113, 191.1, 455/209, 207, 256, 264, 255–263, 313–318, 455/315, 323, 302, 304, 285, 326, 183.1, 455/208; 375/295, 279, 329, 330, 332, 308, 375/52–54, 67, 83, 335, 344, 327, 324, 349; 329/305, 306; 332/103, 104, 105, 170; 331/135, 331/2, 1 R, 22, 34, 46, 12, 18, 54; 342/194; 327/255, 552, 73, 68, 254
See application file for complete search history.

(56) References Cited

U.S. PATENT DOCUMENTS

| | | | |
|---|---|---|---|
| 1,666,206 A | | 4/1928 | Hartley |
| 5,303,417 A | * | 4/1994 | Laws .................... 455/314 |
| 5,412,351 A | * | 5/1995 | Nystrom et al. ........... 332/103 |
| 5,574,755 A | | 11/1996 | Persico ................ 375/295 |
| 6,029,059 A | | 2/2000 | Bojer |
| 6,148,181 A | * | 11/2000 | Otaka ................. 455/86 |
| 6,516,186 B1 | * | 2/2003 | Yamagishi et al. ........ 455/302 |
| 6,529,100 B1 | * | 3/2003 | Okanobu ................ 333/172 |

(Continued)

FOREIGN PATENT DOCUMENTS

EP        0948129        10/1999

(Continued)

OTHER PUBLICATIONS

B. Razavi, "RF Microelectronics," Prentice-Hall, Inc.: Upper Saddle River, NJ, pp. 138-144 (1998).

(Continued)

*Primary Examiner*—Edward F. Urban
*Assistant Examiner*—Charles Chow
(74) *Attorney, Agent, or Firm*—Philip R Wadsworth; Charles D Brown; George C. Pappas

(57) ABSTRACT

In an exemplary application, an apparatus according to a disclosed embodiment receives a radio frequency signal and outputs an intermediate frequency signal. Rejection of image components in the intermediate frequency signal is obtained without the need to preprocess the radio frequency signal with an image reject filter. Such an apparatus may also exhibit an image rejection performance that is robust to frequency deviation of a local oscillator.

30 Claims, 18 Drawing Sheets

U.S. PATENT DOCUMENTS 6,560,449 B1 * 5/2003 Liu .......................... 455/302
2002/0055347 A1 * 5/2002 Spargo et al. .............. 455/302

FOREIGN PATENT DOCUMENTS

GB          2296613      12/1994
GB          2321353      11/1997

OTHER PUBLICATIONS

B. Sharp et al.,"The Design of an Analogue RF Front End for a Multi-role Radio," British Crown Copyright (1998).

J. Zhao, "Behavioral Modeling of RF Circuits in Spectre," Cadence Design Systems (Mar. 5, 1999).

* cited by examiner

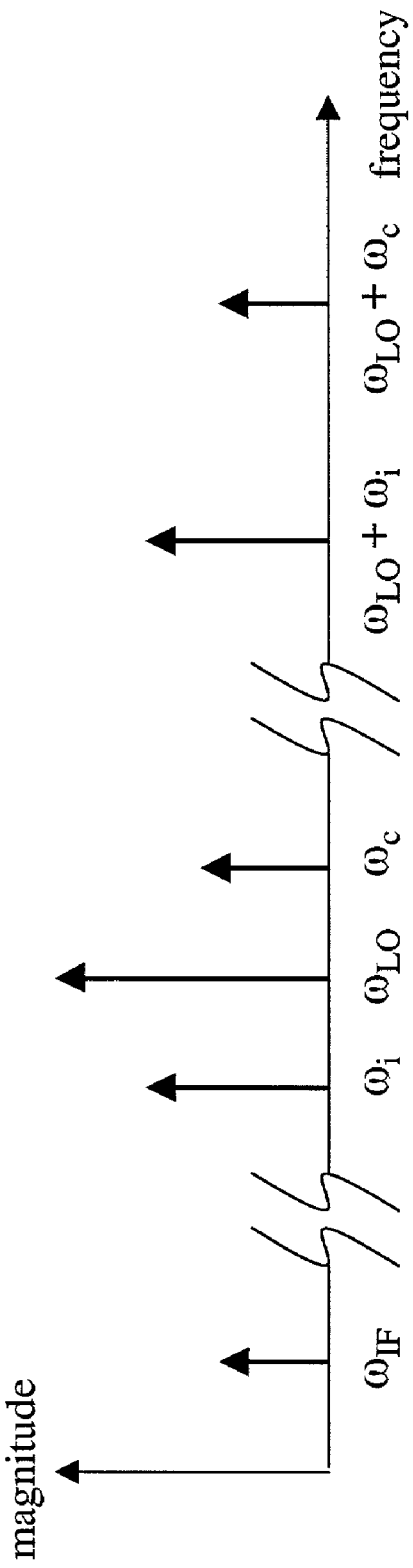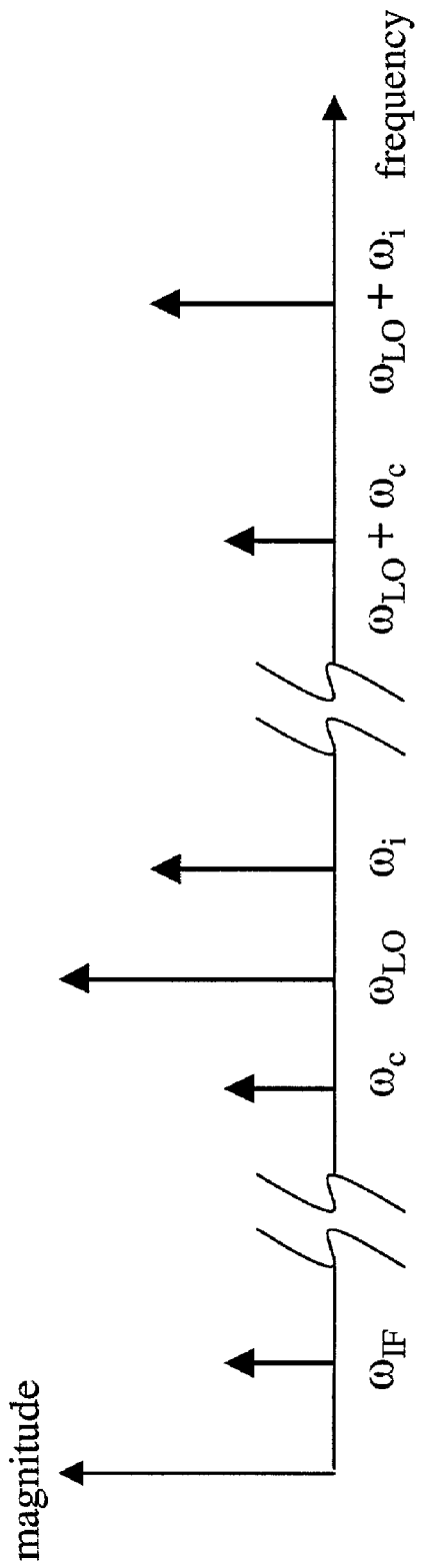

US 7,130,599 B2

QUADRATURE GENERATOR WITH IMAGE REJECT MIXER

RELATED APPLICATIONS

This application claims benefit of U.S. Provisional Patent Application No. 60/245,230, entitled "QUADRATURE GENERATOR WITH IMAGE REJECT MIXER," filed Nov. 3, 2000.

BACKGROUND

1. Field of the Invention

This invention relates to the conversion of radio frequency (RF) signals.

2. Background Information

In general, wireless communications comprises the modulation of one or more baseband information signals onto one or more carrier signals, transmission of the resulting bandpass signal(s), and demodulation at a receiver to recover one or more of the information signals. Modern receivers typically employ the heterodyne technique, which involves either down-converting or up-converting an input RF signal to some convenient intermediate frequency (IF) and then demodulating the IF signal by using an appropriate detector. Heterodyne receivers are easily tunable and offer high stability. The difference between the input and output frequencies of such a receiver also provides a high degree of immunity from self-oscillation due to stray coupling. Additionally, adjacent channel rejection may be obtained by using high-Q filters only in the IF stage, which may operate at a fixed frequency much lower than the carrier frequency.

A basic heterodyne conversion circuit as shown in FIG. 1 may be used to convert all types of modulated RF signals to IF, including broadcast-band AM, FM and television signals; network communication signals as in a cellular telephone or wireless local area network; satellite communications or ranging signals; and radar signals. In such a circuit, the mixer receives the RF signal S10 (for example, as outputted from a RF amplifier) and multiplies it with a signal S20 from a local oscillator 5 to produce an IF signal.

We define the carrier frequency of RF signal S10 to be $\omega_c$, the frequency of local oscillator signal S20 to be $\omega_{LO}$, and the desired frequency of the IF signal to be $\omega_{IF}$ (all in radians/second). Therefore, we may express RF signal S10 as $\cos \omega_c t$, local oscillator signal S20 as $\cos \omega_{LO} t$, and the desired IF signal as $\omega_i t$ (with t in seconds). With reference to the trigonometric identity $$\cos a \cos b = (\tfrac{1}{2})[\cos(a+b) + \cos(a-b)],$$

we can see that the output of the mixer will include a downconverted signal $\cos(\omega_{LO} - \omega_c)t$ and an upconverted signal $\cos(\omega_{LO} + \omega_c)t$. The IF filter is a bandpass filter that receives the output of the mixer and selects either the up-conversion result or the down-conversion result, whichever is chosen by the receiver designer.

FIGS. 2A and 2B are graphical illustrations of heterodyne conversion operations using low-side injection and high-side injection, respectively. In these operations, we assume that downconversion is desired [i.e. $\omega_{IF} = |(\omega_{LO} - \omega_c)|$]. Now consider a case in which RF signal S10 contains not only the desired component at $\omega_c$, but also an undesired image component at a frequency $\omega_i = 2\omega_{LO} - \omega_c$. In both examples, the image component will also downconvert to corrupt the desired IF signal at $\omega_{IF}$. These figures illustrate a major weakness of the basic heterodyne design: its susceptibility to image interference. In order to prevent such a situation, heterodyne designs usually include an image reject filter upstream of the mixer (e.g. as shown in FIG. 3) in order to attenuate any image components before mixing.

Unfortunately, the need for an image reject filter may greatly increase the size and cost of devices such as wireless communication apparatus. Depending on the design requirements of the filter, it may be physically large and very expensive. A need to implement the filter at RF frequencies rather than IF frequencies may compound the difficulty of obtaining a component that is suitable in terms of cost, size, and performance. Additionally, such a filter will typically be supplied as an off-chip component, thereby increasing fabrication costs, necessitating extra pins on the RF/IF chip, and consuming board space. Such requirements are contrary to the increasing need to reduce the size and cost of wireless communications devices, especially in the field of cellular telephony.

FIG. 4 shows a block diagram of a Hartley image reject mixer 100. Such a mixer may be used in a heterodyne conversion circuit (e.g. as shown in FIG. 5) as a smaller and less expensive alternative to an image reject filter. Unfortunately, the rejection performance of this approach is highly dependent on very close matching between the two signal paths in terms of both gain and phase. Moreover, even under careful manufacturing conditions, such an image reject mixer achieves good results only over a limited frequency band. Shortcomings such as these make the configuration of FIG. 5 unsuitable for applications that require high levels of image rejection (e.g. greater than 35–40 dB).

SUMMARY

A converter according to one embodiment of the invention includes an image reject mixer and a quadrature signal generator. The quadrature signal generator receives first and second oscillator signals and outputs a quadrature signal pair. The image reject mixer produces an output signal based on the quadrature signal pair and an input signal. In at least some implementations of such a converter, a phase relation between the quadrature signal pair is robust to changes in the frequency of at least one of the oscillator signals.

BRIEF DESCRIPTION OF THE DRAWINGS

FIG. 2A is a diagram showing representative frequencies of a low-side injection downconversion;

FIG. 2B is a diagram showing representative frequencies of a high-side injection downconversion;

DETAILED DESCRIPTION

Figure 1:
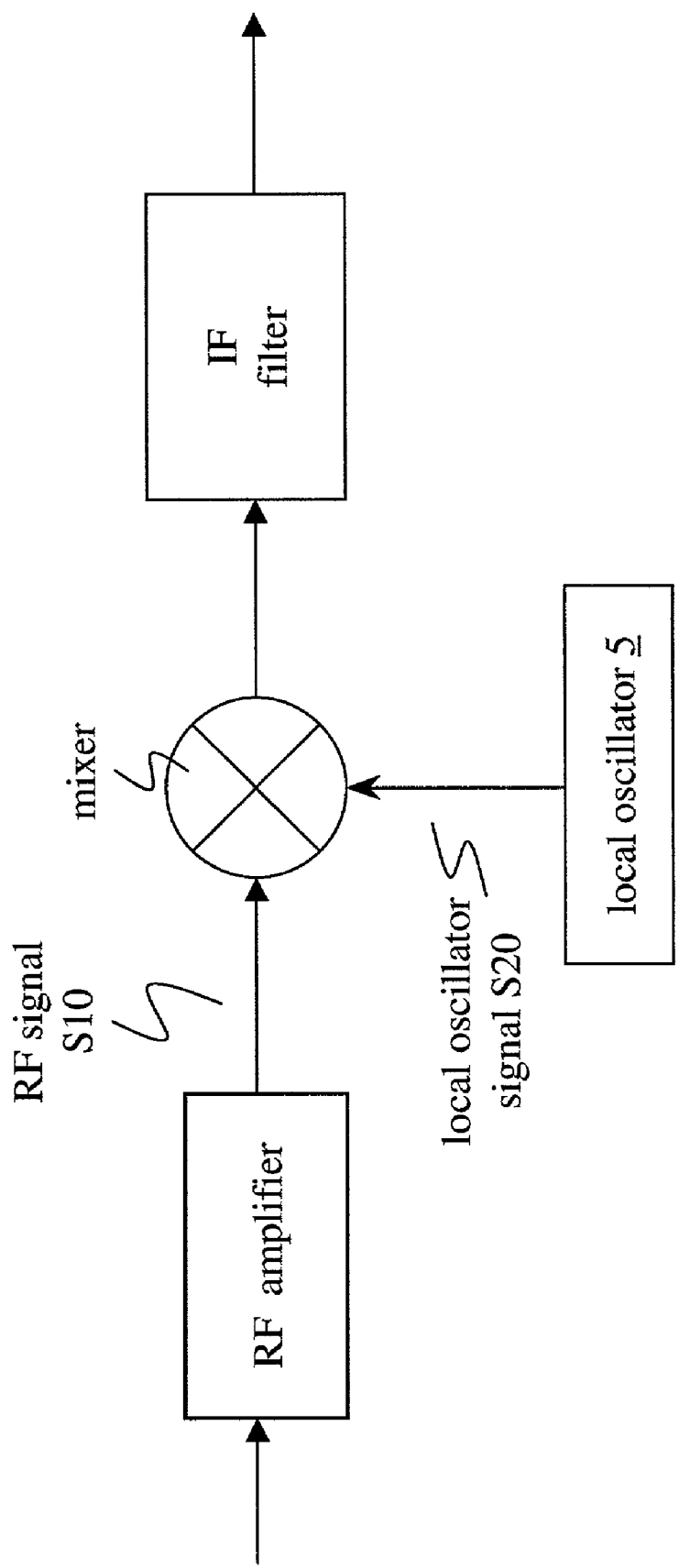
FIG. 1 is a block diagram of a circuit for heterodyne conversion.
Figure 3:
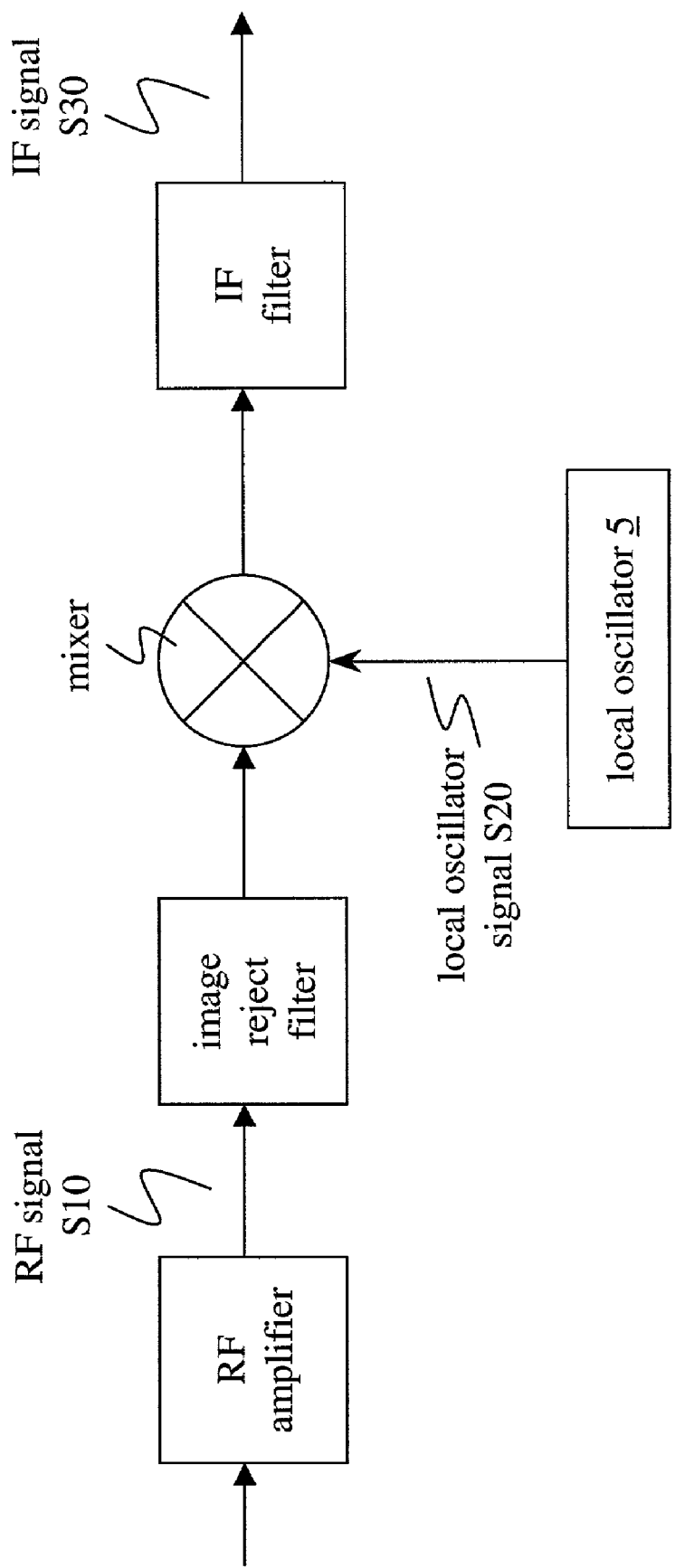
FIG. 3 is a block diagram of a circuit for heterodyne conversion that includes an image reject filter.
Figure 4:
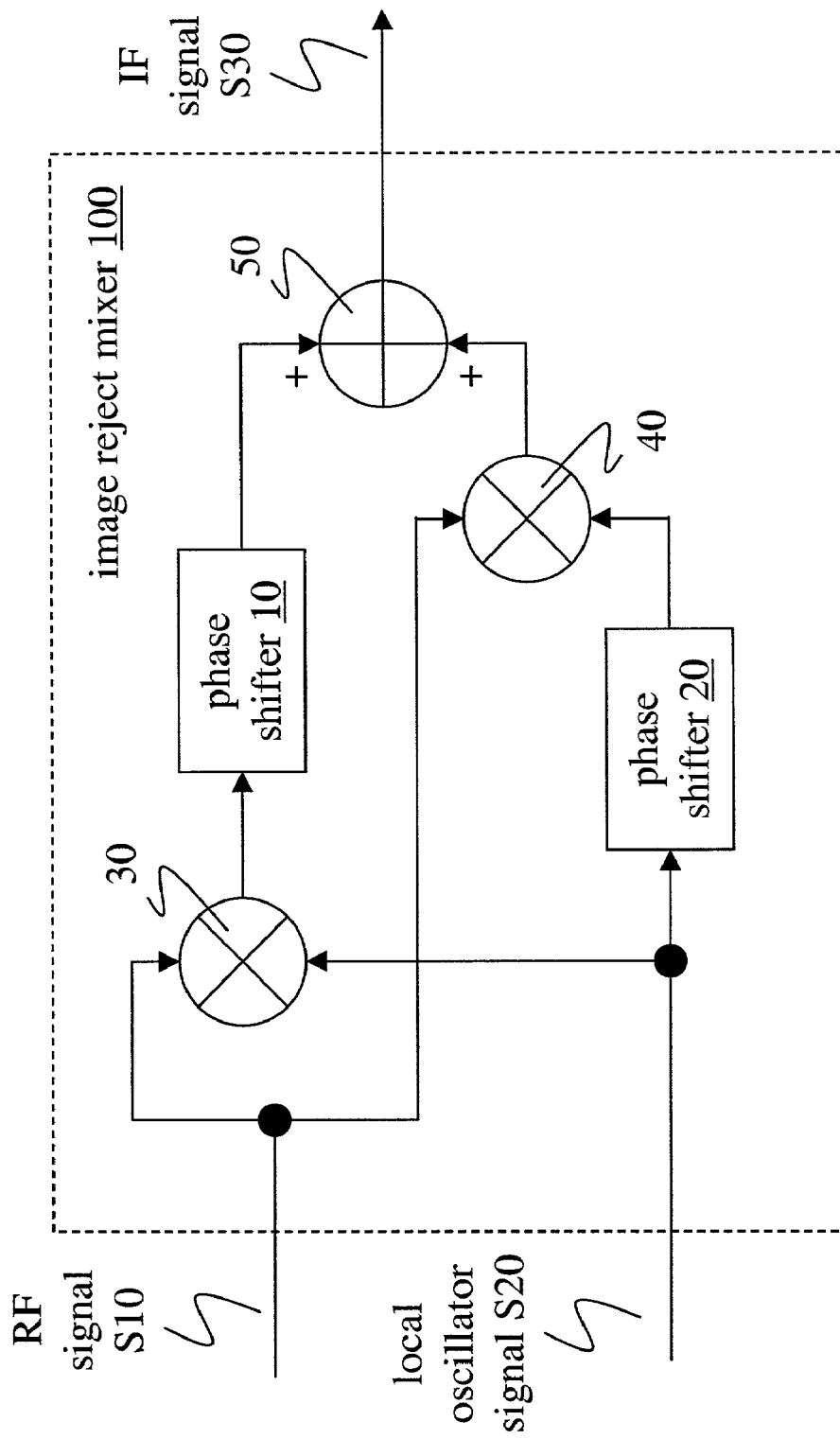
FIG. 4 is a block diagram of an image reject mixer 100.
Figure 5:
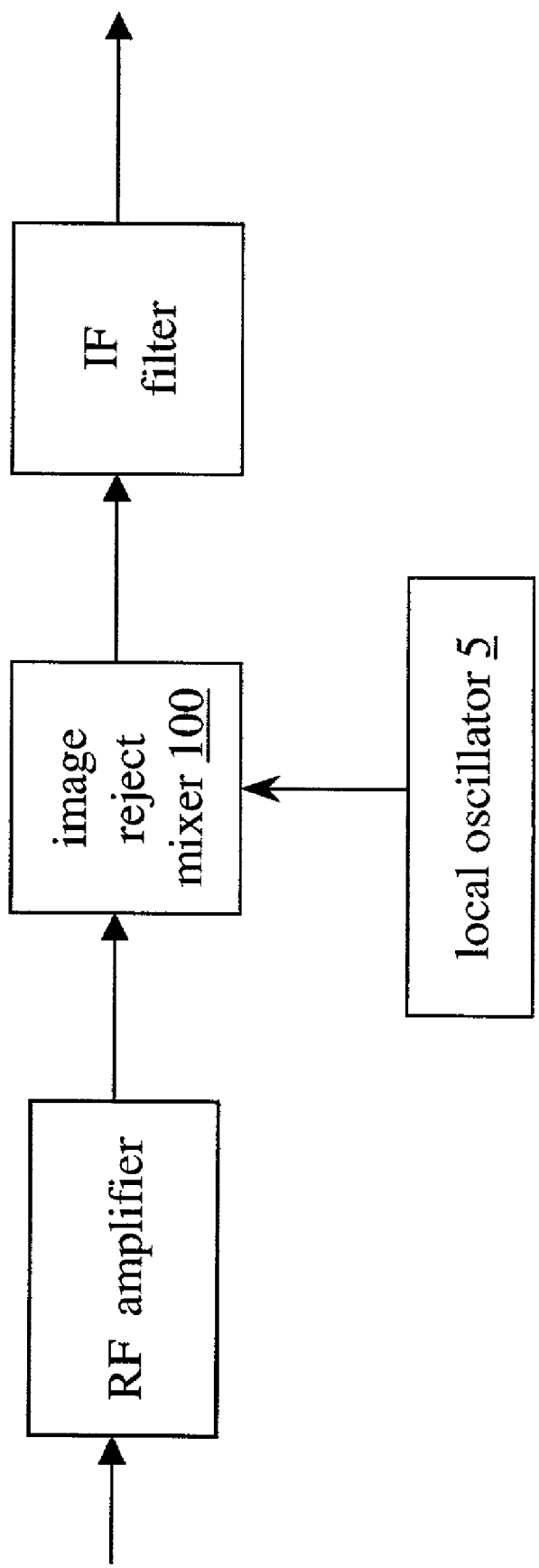
FIG. 5 is a block diagram of a circuit for heterodyne conversion that includes the image reject mixer 100.

While the conversion circuit shown in FIG. 5 may be a smaller and less expensive alternative to one that includes an image reject filter, it suffers from a susceptibility to changes in the frequency of local oscillator 5. This susceptibility is a consequence of the nonideal behavior of phase shifter 20 with respect to changes in the frequency of the signal that drives it. Specifically, as the frequency of local oscillator signal S20 drifts away from $\omega_{LO}$ (e.g. because of local heating, changes in ambient temperature, electromagnetic interference, component aging, etc.), the shift performed by phase shifter 20 may deviate from 90 degrees. Variances during circuit fabrication may also cause a frequency error in the output of the local oscillator, producing a similar deviation of this phase relation from the expected value.

As explained elsewhere (e.g., by Behzad Razavi in *RF Microelectronics*, Prentice Hall PTR, Upper Saddle River, N.J., 1998, ISBN 0-13-887571-5 at Chapter 5, section 5.2), an error in the output of phase shifter 20 may prevent image reject mixer 100 from canceling the unwanted image components, thereby allowing them to corrupt IF signal S30. Even in the absence of an image component in RF signal S10, the error may cause distortion (e.g. phase distortion) in IF signal S30. It is desirable to obtain a heterodyne conversion operation that is more tolerant of local oscillator frequency drift and deviation.

Figure 6:
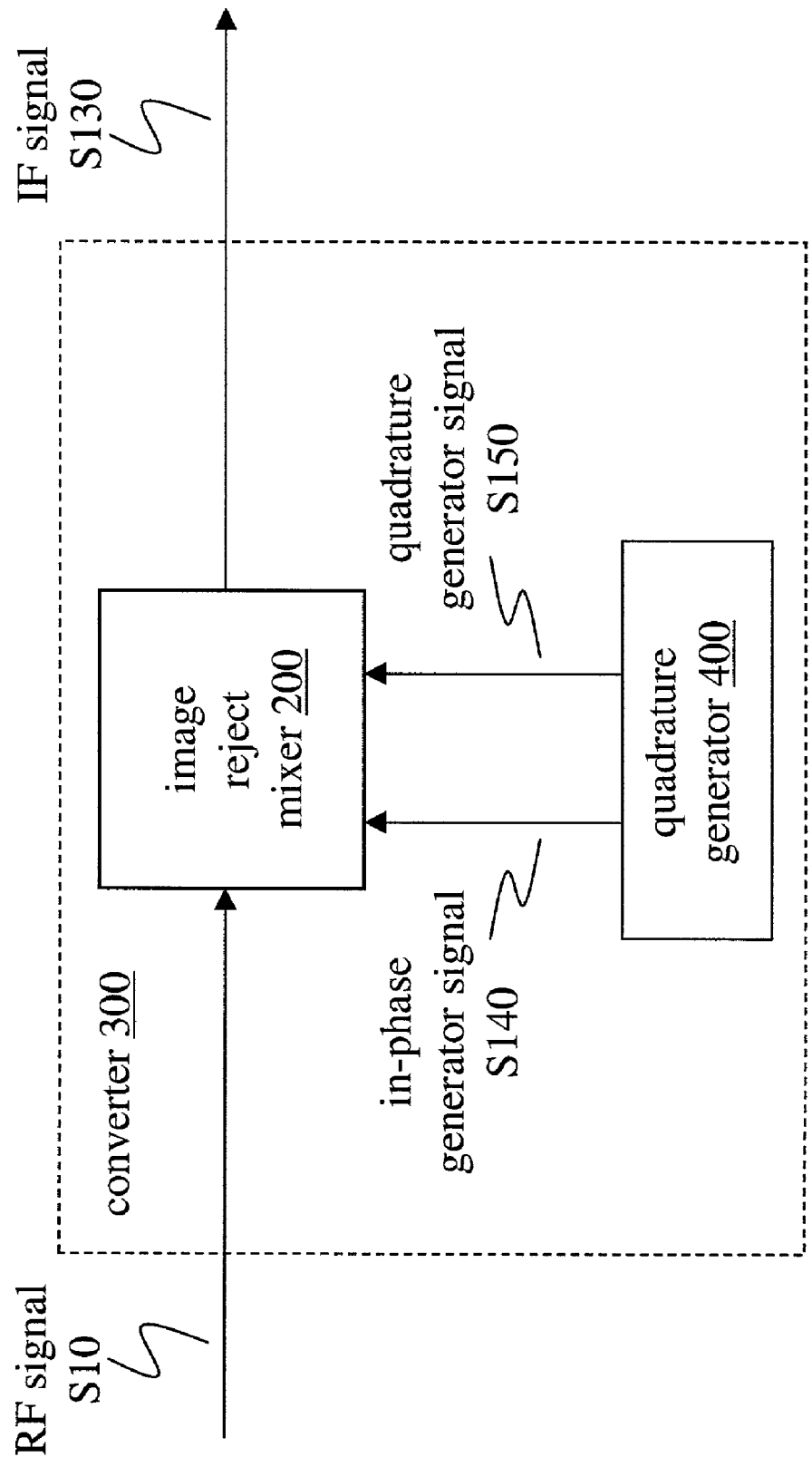
FIG. 6 is a block diagram of a converter 300 according to an embodiment of the invention.

FIG. 6 shows a block diagram of a converter 300 according to an embodiment of the invention that is configured and arranged to receive a RF signal S10 and output an IF signal S130. Converter 300 includes an image reject mixer 200 and a quadrature generator 400 that supplies in-phase and quadrature generator signals S140 and S150 (both signals having a frequency $\omega_g$) to image reject mixer 200.

Figure 7:
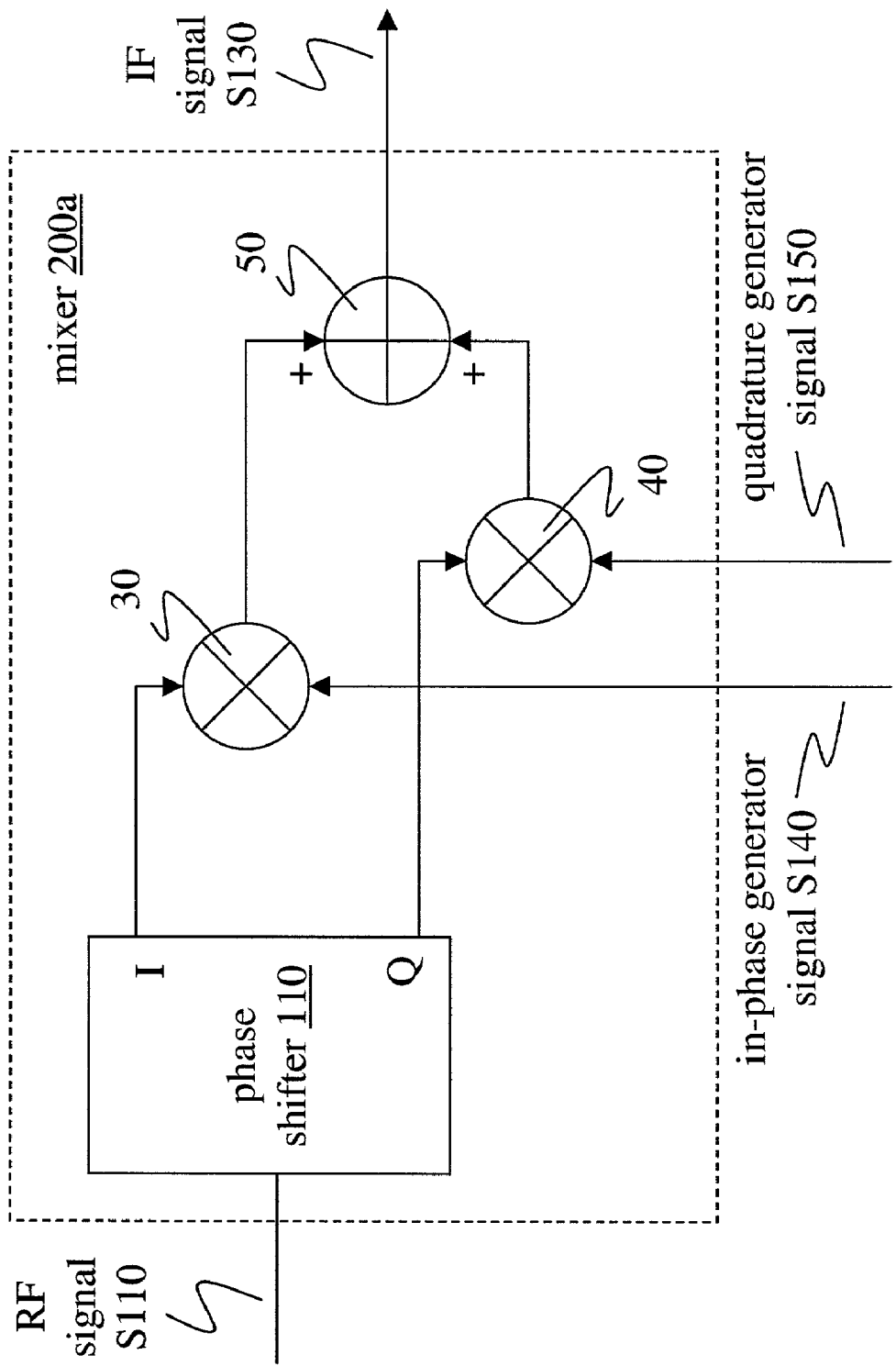
FIG. 7 is a block diagram of an implementation 200a of image reject mixer 200.

FIG. 7 shows a block diagram of an implementation 200*a* of image reject mixer 200. In this circuit, phase shifter 110 receives RF signal S110 and outputs I and Q signals as indicated. These I and Q signals have the same frequency as RF signal S110, have the same amplitude as each other, and are ninety degrees out-of-phase (in this example, the phase angle of the Q signal is ninety degrees ($\pi/2$ radians) less than the phase angle of the I signal).

Figure 8:
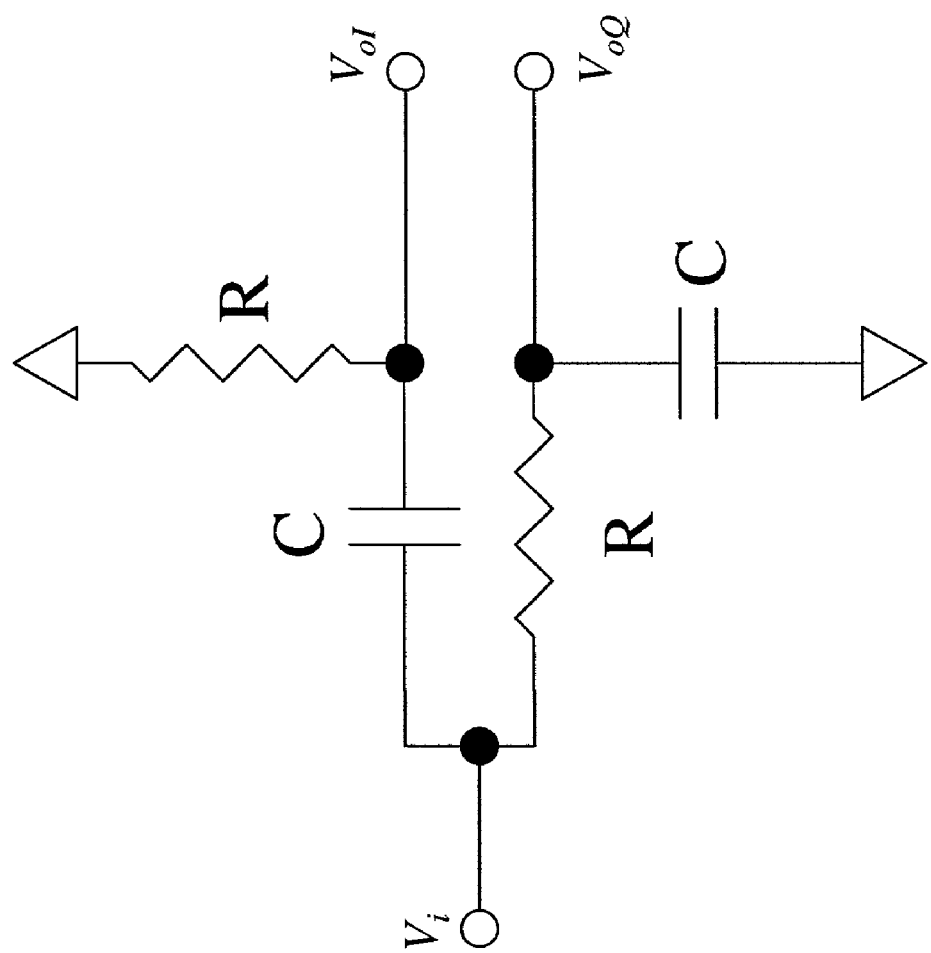
FIG. 8 is a schematic diagram of a phase shifter.
Figure 9:
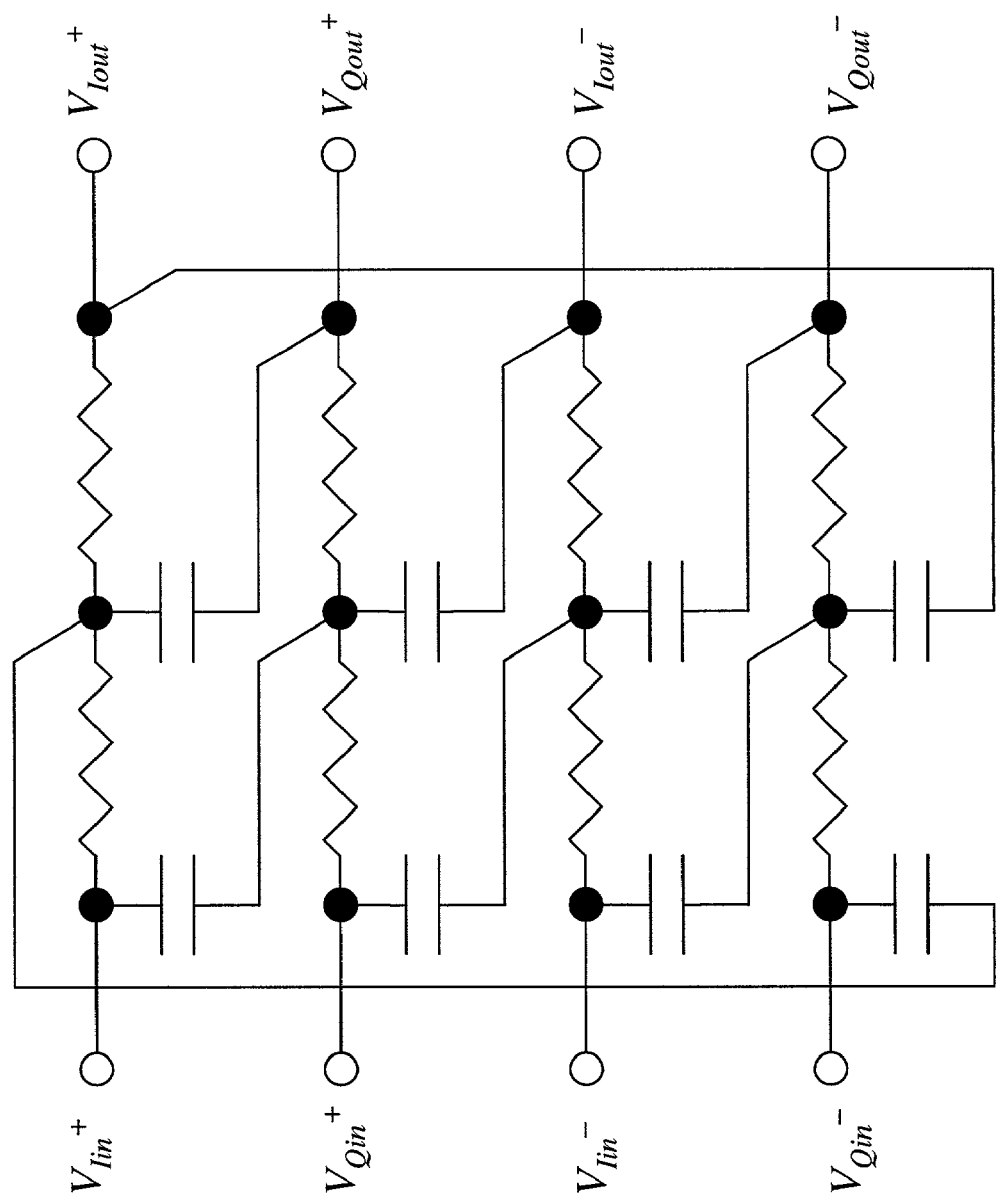
FIG. 9 is a schematic diagram of another phase shifter.

FIG. 8 shows one possible implementation for phase shifter 110, where the values of resistance R and capacitance C are based at least in part on the frequency of the input signal applied to the phase shifter. A polyphase filter constructed from resistive and capacitive components may also be used as a phase shifter. For example, FIG. 9 shows a two-stage sequence asymmetric polyphase filter. Factors that may guide a choice of phase shifter configuration for a particular application include insertion loss, effect of frequency shift on phase error, and robustness of the circuit to variations in component or material parameters (e.g. sheet resistance) that may be encountered during fabrication.

Mixer 30 receives the I signal outputted by phase shifter 110, and mixer 40 receives the corresponding Q signal. These mixers may be fabricated using Gilbert cell multipliers, diode or MOSFET passive mixers, and/or other circuits suitable for use as mixers at the desired frequencies. As shown in FIG. 7, mixers 30 and 40 also receive in-phase and quadrature generator signals S140 and S150, respectively. These two generator signals have the same amplitude and frequency as each other, but are ninety degrees out-of-phase (in this example, the phase angle of quadrature generator signal S150 is ninety degrees ($\pi/2$ radians) less than the phase angle of in-phase generator signal S140).

Combiner 50 performs an additive combination of the mixer output signals to produce IF signal S130. For low-side injection and with the polarities of combiner 50 as shown in FIG. 7, converter 300 produces an IF signal having the frequency $\omega_{IF}=\omega_c-\omega_g$. In other implementations, the direction of the 90-degree relation between the outputs of phase shifter 110, the direction of the 90-degree relation between generator signals S140 and S150, and/or one or both of the polarities of combiner 50 may be reversed (e.g. to choose an upconversion result instead).

Figure 10:
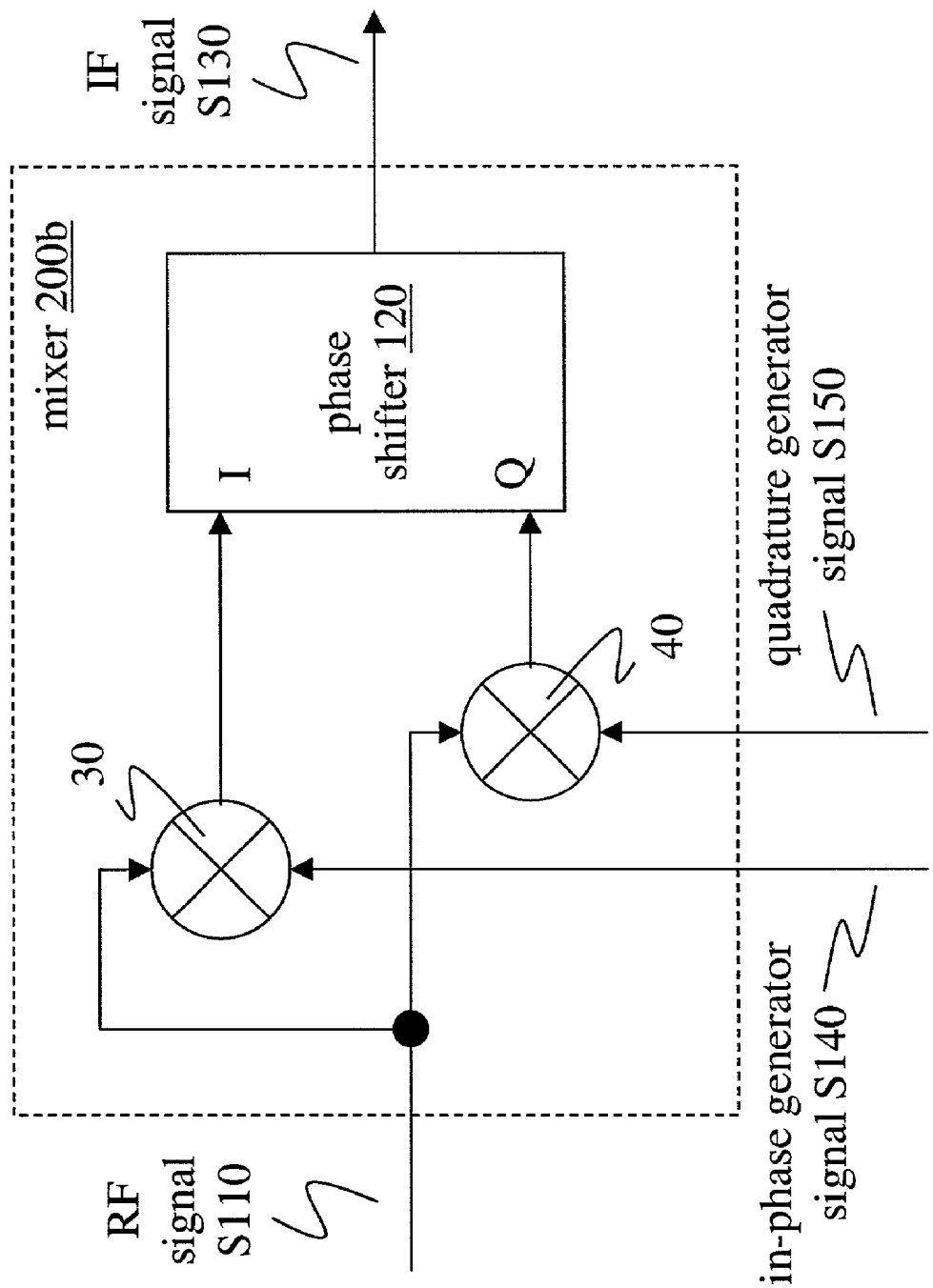
FIG. 10 is a block diagram of an alternate implementation 200b of image reject mixer 200.

FIG. 10 shows a block diagram for another implementation 200*b* of image reject mixer 200. Phase shifter 120 receives the signals outputted by mixers 30 and 40 at its I and Q inputs, respectively, and induces a ninety-degree phase shift between them. In this example, phase shifter 120 performs a ninety-degree phase delay on the Q input signal in relation to the I input signal. Phase shifter 120 may be implemented using techniques similar to those described above with respect to phase shifter 110. For example, the phase shifter of FIG. 8 may be used, with terminals $V_{oI}$ and $V_{oQ}$ as inputs and $V_i$ as output.

Figure 11:
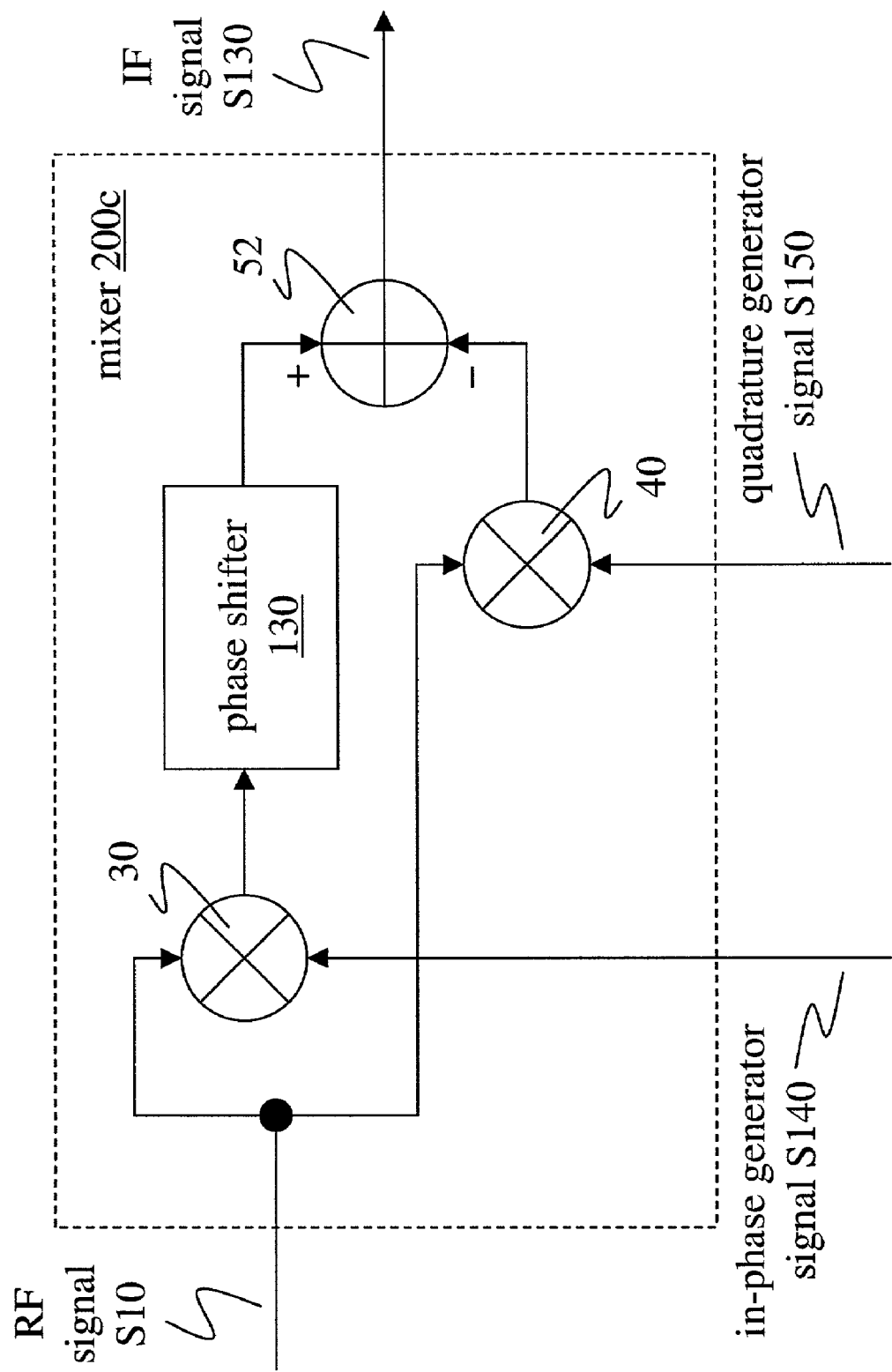
FIG. 11 is a block diagram of an alternate implementation 200c of image reject mixer 200.
Figure 12:
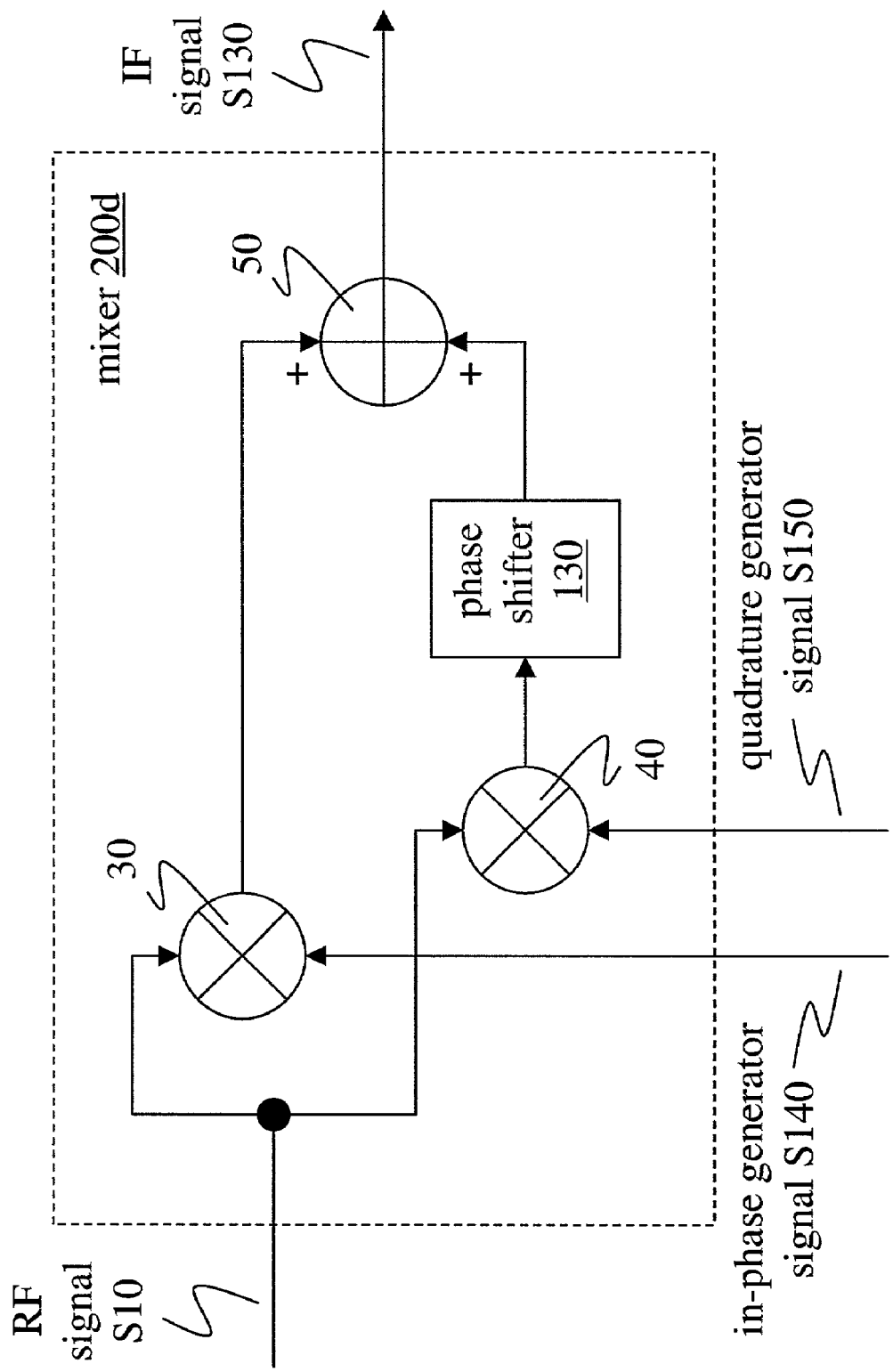
FIG. 12 is a block diagram of an alternate implementation 200*d* of image reject mixer 200.

Several other forms of image reject mixer 200 are possible, and a particular configuration may be selected based upon such considerations as circuit topology and component proximity to radiating elements. FIG. 11 shows a block diagram for another implementation 200*c* of image reject mixer 200 that includes a phase shifter 130. In this example, phase shifter 130 (which may be implemented using techniques similar to those described above with respect to phase shifter 110) performs a ninety-degree phase delay. To obtain the downconversion result in this case, one polarity of combiner 52 is inverted (e.g. as indicated in the figure). FIG. 12 shows a block diagram for a similar implementation 200*d* of image reject mixer 200 wherein phase shifter 310 receives a signal outputted by mixer 40.

Figure 13:
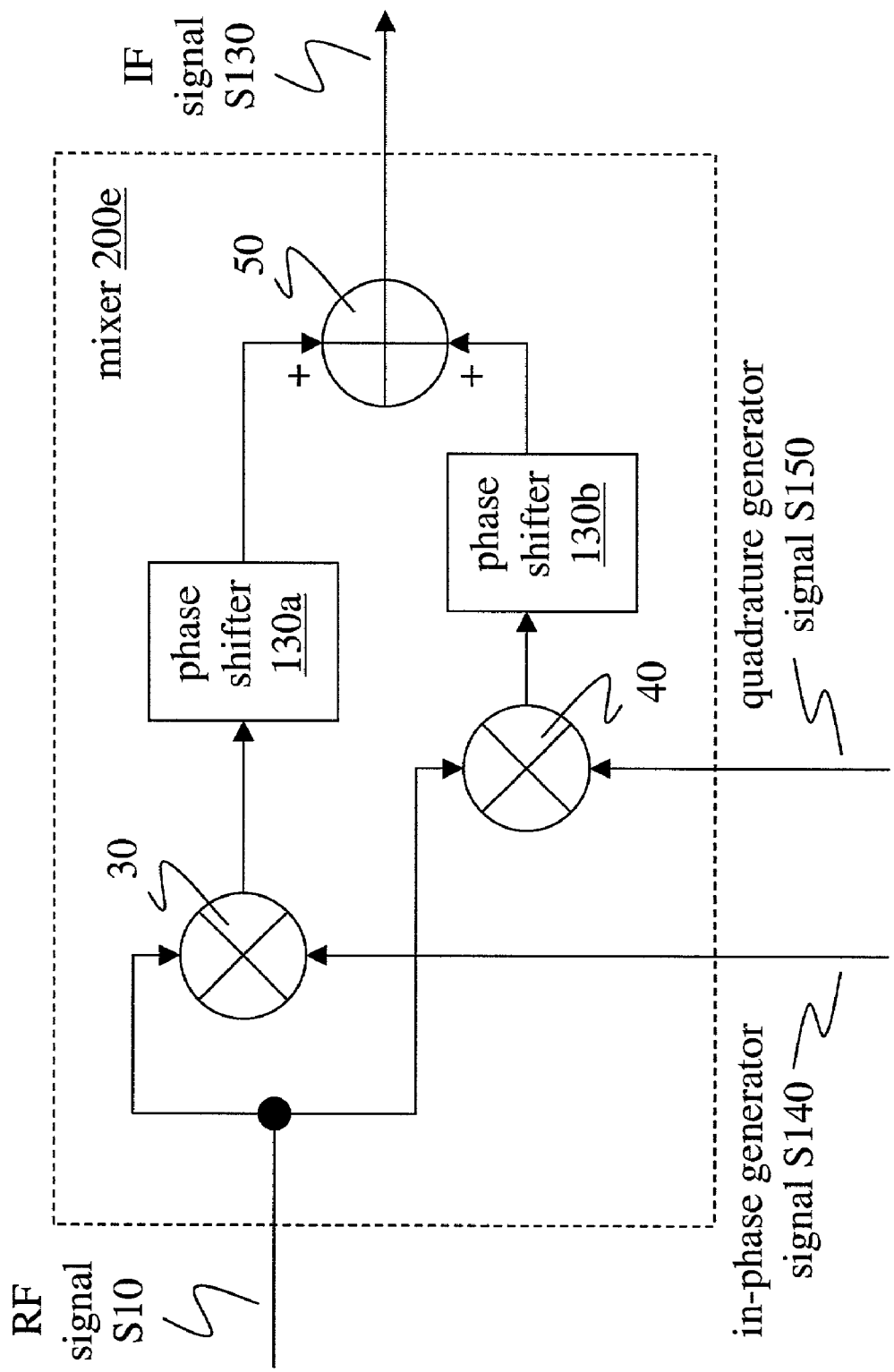
FIG. 13 is a block diagram of an alternate implementation 200*e* of image reject mixer 200.
Figure 14:
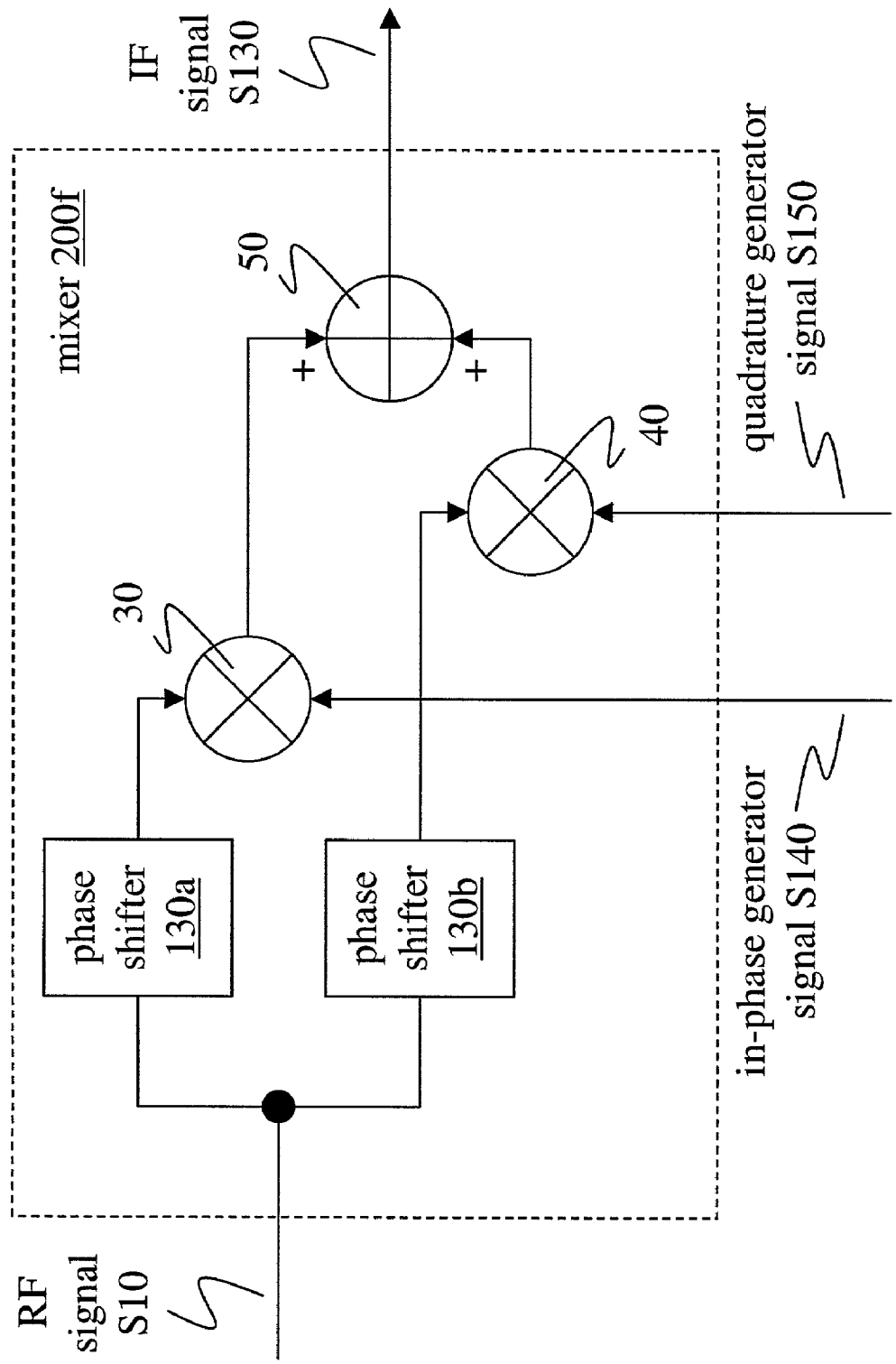
FIG. 14 is a block diagram of an alternate implementation 200*f* of image reject mixer 200.

FIG. 13 shows an alternative implementation 200*e* of image reject mixer 200. In this example, phase shifter 130*a* performs a forty-five-degree ($\pi/4$ radians) phase shift on a signal outputted by mixer 30, while phase shifter 130*b* performs a one-hundred-thirty-five-degree ($5\times\pi/4$ radians) phase shift on a signal outputted by mixer 40. In another implementation, a different phase relation between the phase-shifted signals may be obtained by configuring one or both phase shifters to produce a different phase shift. Phase shifters 130*a* and 130*b* may each be implemented using techniques similar to those described above with respect to phase shifter 110. FIG. 14 shows a block diagram for a similar implementation 200*f* of image reject mixer 200 wherein phase shifters 130*a* and 130*b* precede mixers 30 and 40 in their respective signal paths.

One advantage that may be realized by using two phase shifters in an image reject mixer 200 (e.g. as shown in FIGS. 13 and 14) is that the performances of the phase shifters may track each other over variations that occur during fabrication and/or during operation. Process variations encountered during fabrication, for example, may cause an absolute error of up to ten degrees in a fabricated phase shifter. By constructing the mixer to include two phase shifters instead of only one, this absolute error may be compensated to some extent, and a more accurate result may be obtained as a phase relation between the outputs of the two phase shifters.

It may be desirable to design a phase shifter to have an optimal phase-shifting performance over a particular frequency range. In such a case, it may be desirable to design a phase shifter for use in image reject mixer 200 to have an optimal phase-shifting performance at the frequency to be rejected rather than at the frequency to be selected. In a low-side injection application of FIG. 11, for example, it may be desirable to design phase shifter 130 for optimal operation at $\omega_c + \omega_g$ (i.e. the frequency to be canceled in combiner 52) rather than at the selected intermediate frequency. Such a design choice may represent a tradeoff between a reduced signal amplitude on one hand and the presence of image interference on the other hand.

Figure 15:
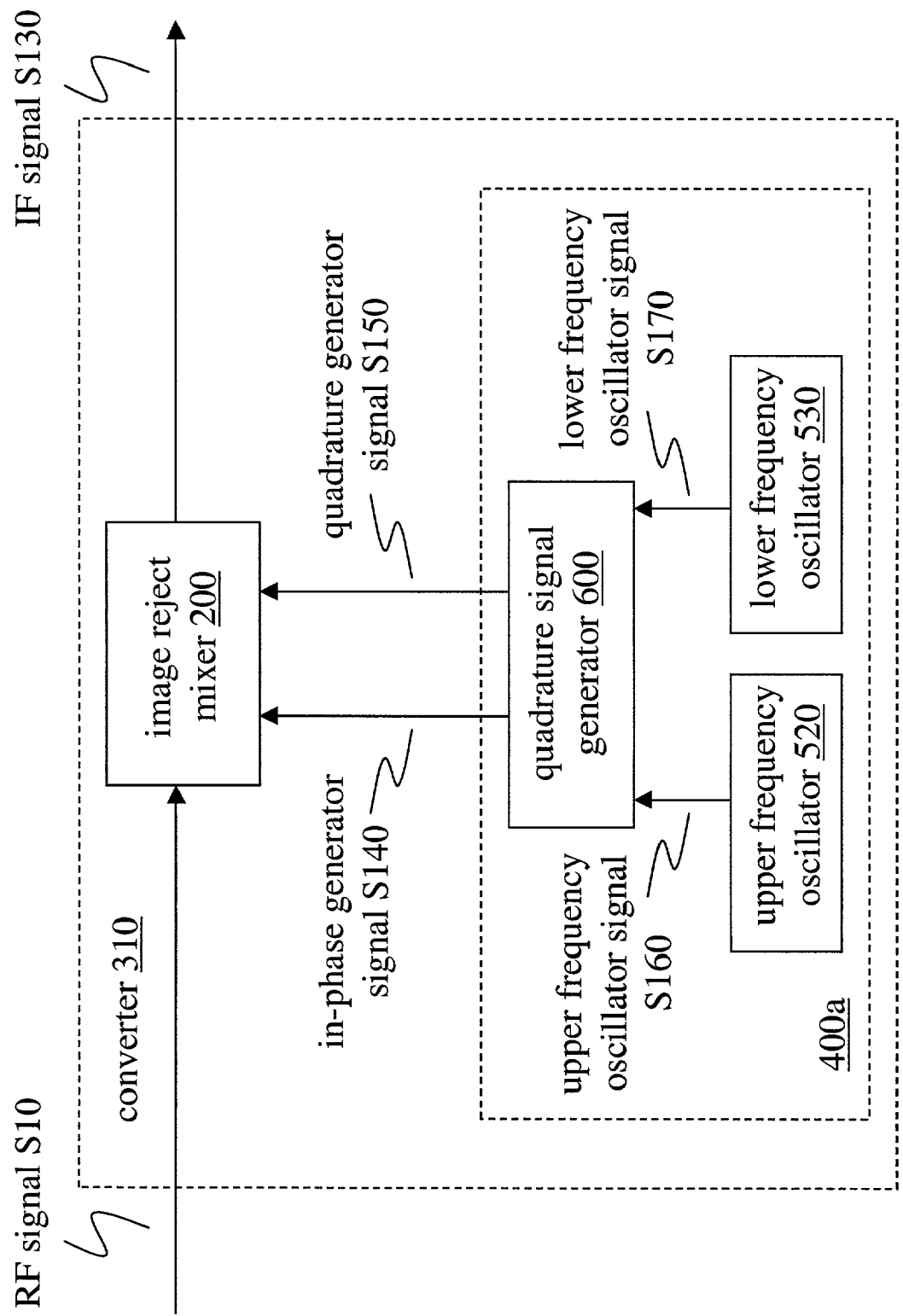
FIG. 15 is a block diagram of a converter 310 according to an alternate embodiment of the invention.

FIG. 15 shows a block diagram of a converter 310 according to another embodiment of the invention. In this example, image reject mixer 200 (e.g. according to an implementation as described above) receives generator signals S140 and S150 from quadrature signal generator 600. In addition to quadrature signal generator 600, an implementation 400a of quadrature generator 400 includes an upper frequency oscillator 520 and a lower frequency oscillator 530. Upper frequency oscillator 520 outputs an upper frequency oscillator signal S160 whose angular frequency is expressed herein as $\omega_U$ radians/second, and lower frequency oscillator 530 outputs a lower frequency oscillator signal S170 whose angular frequency is expressed herein as $\omega_L$ radians/second. Quadrature signal generator 600 receives the two oscillator signals S160 and S170 and outputs the generator signals S140 and S150.

Figure 16:
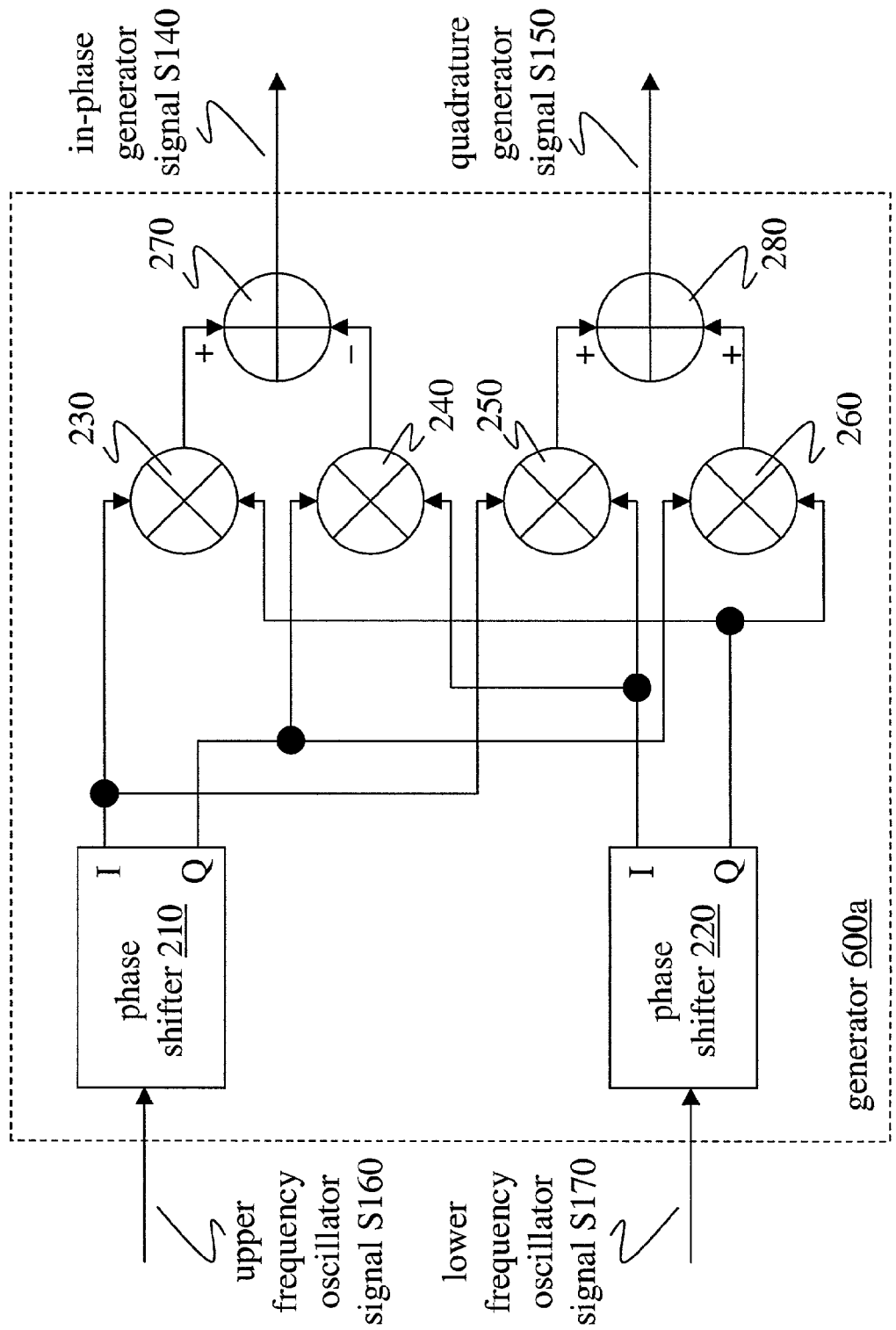
FIG. 16 is a block diagram of a quadrature signal generator 600*a* suitable for use in a converter according to an embodiment of the invention.
Figure 17:
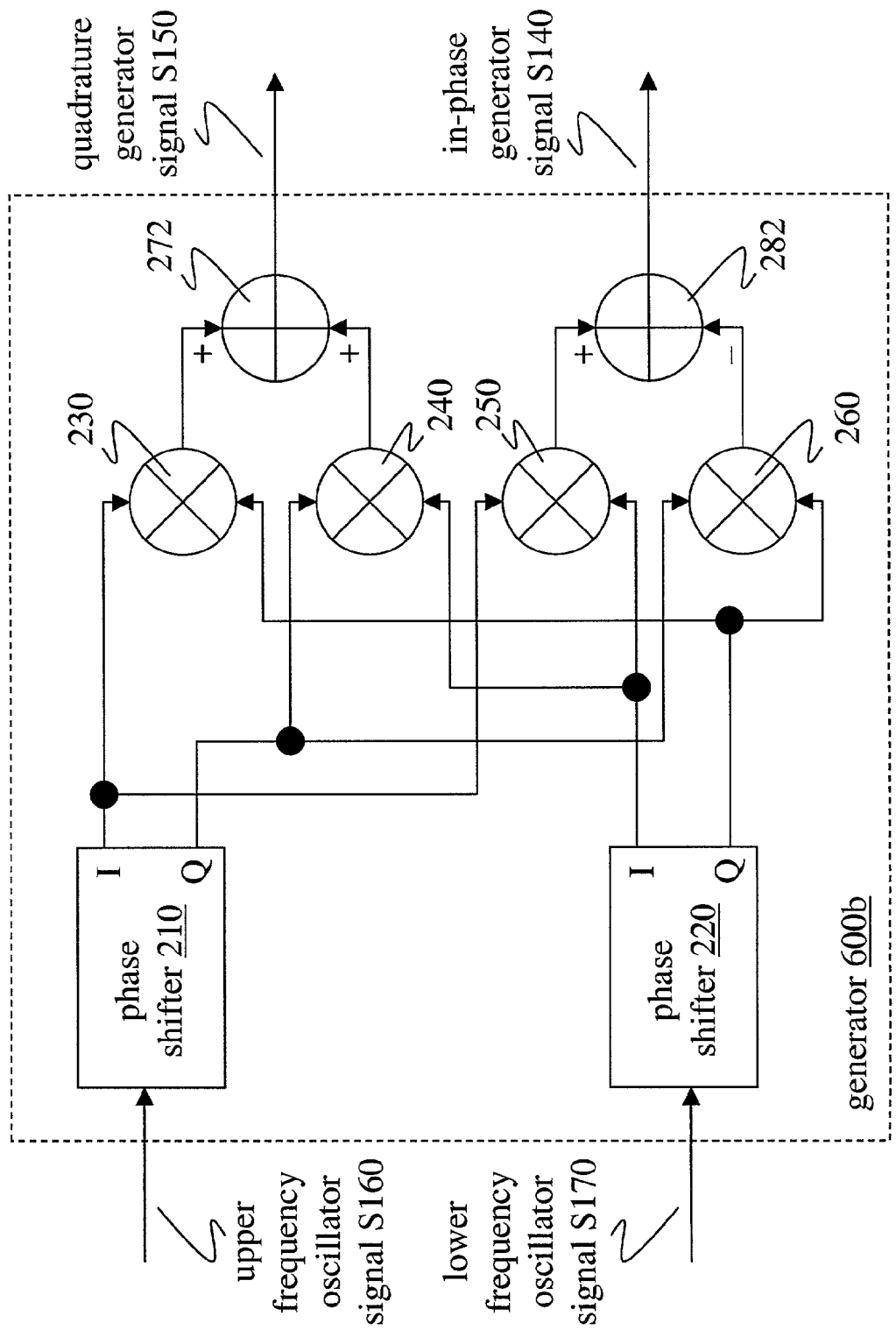
FIG. 17 is a block diagram of a quadrature signal generator 600*b* suitable for use in a converter according to an embodiment of the invention.

FIG. 16 shows a block diagram of a quadrature signal generator (specifically, a single-sideband quadrature signal generator) 600a suitable for use in converter 310. Phase shifters 210 and 220 (which may be constructed in the same fashion as phase shifter 110) receive upper frequency oscillator signal S160 and lower frequency oscillator signal S170, respectively, and present quadrature pairs to mixers 230–260 (which may also be constructed as described above). With the polarities as shown in FIG. 16 at the inputs to combiners 270 and 280, the frequency of in-phase generator signal S140 and quadrature generator signal S150 (designated above as $\omega_g$) may be expressed as $(\omega_U - \omega_L)$. FIG. 17 shows an alternate structure for a quadrature signal generator 600b wherein the frequency of in-phase generator signal S140 and quadrature generator signal S150 may be expressed as $(\omega_U + \omega_L)$. Several other structures for the quadrature signal generator are possible.

One advantage that the use of a quadrature signal generator (e.g. as shown in FIG. 16 or 17) may provide to a converter 310 is that the phase relation between in-phase generator signal S140 and quadrature generator signal S150 remains substantially constant even in situations where the frequency of upper frequency oscillator signal S160 and/or lower frequency oscillator signal S170 drifts. This constancy may allow converter 310 to maintain a high level of image rejection performance even as such frequency drifts occur (due, for example, to changes in ambient temperature, localized heating, component aging, and/or variations in supply voltage). As a consequence, a structure that is less ideal in terms of frequency drift but is preferred in terms of other design criteria (such as cost or chip area consumed) may be used for one or both of oscillators 520 and 530 to obtain a desired conversion performance in a converter according to an embodiment of the invention.

Figure 18:
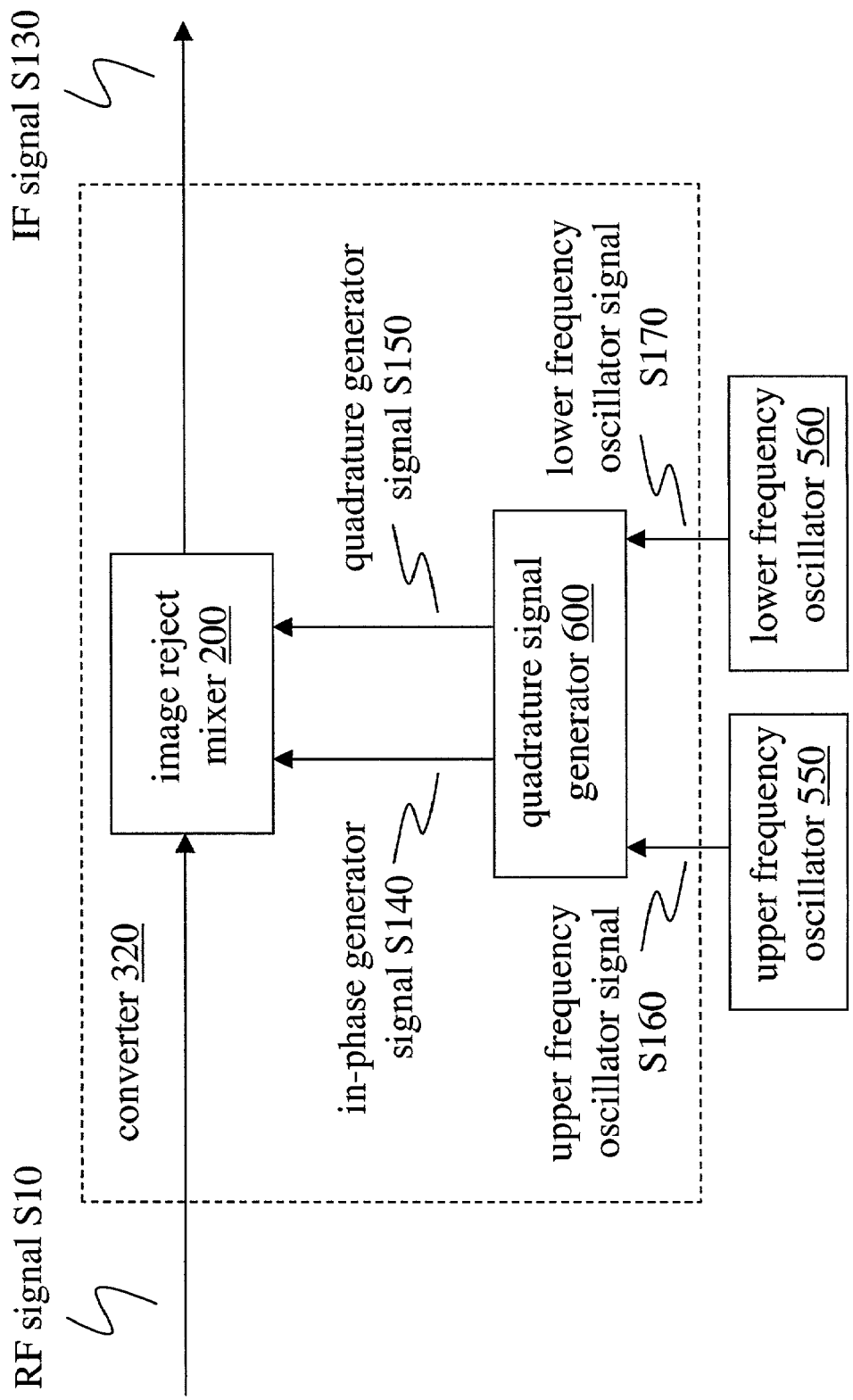
FIG. 18 is a block diagram of a converter 320 according to an embodiment of the invention.

FIG. 18 shows a block diagram of a system that includes a converter 320 according to an embodiment of the invention and two oscillators: upper frequency oscillator 550 and lower frequency oscillator 560. This configuration may be used in an application where one or more oscillators are already available. In a receiver that processes other RF signals in addition to RF signal S10, for example, one or more local oscillators may already be available for use as upper frequency oscillator 550 or lower frequency oscillator 560.

In an exemplary application of converter 320, RF signal S10 is a Global Positioning Satellite (GPS) signal having a carrier frequency of 1.57542 GHz, upper frequency oscillator 550 is a UHF local oscillator used in the reception of cellular telephone signals, and lower frequency oscillator 560 is a voltage-controlled oscillator (VCO). Upper frequency oscillator 550 may have a frequency in the approximate range 800–1200 MHz for cellular band applications or in the approximate range 1600–2200 MHz for PCS (Personal Communications System) applications. A frequency of lower frequency oscillator 560 may be selected based on such factors as the desired GPS IF frequency (e.g. 120–200 MHz), the desired frequency of in-phase and quadrature generator signals S140 and S150, and the particular configuration used for image reject mixer 200. In a case where the frequency of upper frequency oscillator 550 may change (e.g. to switch between cellular and PCS applications), an output frequency of lower frequency oscillator 560 may also be switchable (e.g. in conjunction with that of upper frequency oscillator 550).

The foregoing presentation of the described embodiments is provided to enable any person skilled in the art to make or use the present invention. Various modifications to these embodiments are possible, and the generic principles presented herein may be applied to other embodiments as well. For example, an embodiment of the invention may be implemented in part or in whole as a hard-wired circuit or as a circuit configuration fabricated into an application-specific integrated circuit, alone or in combination with other analog and/or digital circuitry. Likewise, other embodiments may be implemented in part or in whole as a firmware program loaded into non-volatile storage or a software program loaded from or into a data storage medium as machine-readable code, such code being instructions executable by an array of logic elements such as a microprocessor or other digital signal processing unit.

Additionally, while receiving applications are discussed, embodiments of the invention may be used in transmitting applications as well. Moreover, the embodiments of the invention are not limited to any particular construction technique or frequencies that may be mentioned in a description of an exemplary implementation. For example, an image reject mixer as used in a converter according to an embodiment of the invention may also include one or more lowpass, highpass, or bandpass filters to attenuate undesired components. Likewise, each among the various different configurations of a mixer coupled to a phase shifter that may be implemented in a signal path of an image reject mixer (e.g. as illustrated in FIGS. 7 [phase shifter 110 and mixer 30 or 40], 10 [phase shifter 120 and mixer 30 or 40], 11

[mixer 30 and phase shifter 130], and 14 [e.g. phase shifter 130a and mixer 30]) may be characterized generically as a mixer/phase shifter combination that produces an output component signal. Thus, the present invention is not intended to be limited to the embodiments shown above but rather is to be accorded the widest scope consistent with the principles and novel features disclosed in any fashion herein.

What is claimed is:

1. A convener for use in RF-to-IF downconversion comprising:
   an image reject mixer configured and arranged to receive an input signal and a quadrature signal pair and to produce an output signal having a non-zero center frequency and based on the input signal and the quadrature signal pair; and
   a quadrature signal generator configured and arranged to receive a first oscillator signal and a second oscillator signal and to produce the quadrature signal pair,
   wherein each of the quadrature signal pair is based on both the first oscillator signal and the second oscillator signal.

2. The convener according to claim 1, wherein the image reject mixer comprises:
   a first mixer configured and arranged to receive one among the quadrature signal pair and a signal based on the input signal and to output a first mixed signal; and
   a second mixer configured and arranged to receive the other among the quadrature signal pair and a signal based on the input signal and to output a second mixed signal,
   wherein the output signal is based on the first and second mixed signals.

3. The converter according to claim 2, wherein the image reject mixer further comprises a phase shifter configured and arranged to receive one among the first and second mixed signals and to output a phase-shifted signal, wherein the output signal is based on the phase-shifted signal.

4. The converter according to claim 3, wherein the phase shifter comprises a polyphase filter.

5. The convener according to claim 3, wherein the phase shifter is configured and arranged to perform a phase shift having a magnitude of ninety degrees.

6. The convener according to claim 2, wherein the image reject mixer further comprises:
   a first phase shifter configured and arranged to receive the first mixed signal and to output a first phase-shifted signal; and
   a second phase shifter configured and arranged to receive the second mixed signal and to output a second phase-shifted signal,
   wherein the output signal is based on the first and second phase-shifted signals.

7. The convener according to claim 6, wherein the magnitude of a phase difference between the first and second phase-shifted signals is ninety degrees.

8. The converter according to claim 7, wherein at least one among the first and second phase shifters comprises a polyphase filter.

9. The convener according to claim 6, wherein at least one among the first and second phase shifters comprises a polyphase filter.

10. The converter according to claim 2, wherein the image reject mixer further comprises a combiner configured and arranged to receive a signal at least based on the first mixed signal and a signal at least based on the second mixed signal and to output the output signal.

11. The convener according to claim 2, wherein at least one among said first mixer and said second mixer comprises a Gilbert cell multiplier.

12. The convener according to claim 1, wherein the quadrature signal generator is robust to changes in the frequency of at least one among the first and second oscillator signals.

13. The convener according to claim 1, wherein a frequency of at least one among the quadrature signal pair is one among a sum and a difference of a frequency of the first oscillator signal and a frequency of the second oscillator signal.

14. The convener according to claim 13, wherein a frequency of one among the quadrature signal pair is equal to a frequency of the other among the quadrature signal pair.

15. The convener according to claim 1, wherein a frequency of the input signal is greater than four hundred megahertz.

16. In a converter for use in a RF-to-IF downconversion, a method comprising:
   receiving a first oscillator signal and a second oscillator signal;
   producing a quadrature signal pair based on the first oscillator signal and the second oscillator signal;
   receiving an input signal; and
   producing an output signal having a non-zero center frequency and based on the input signal and the quadrature signal pair,
   wherein each of the quadrature signal pair is based on both the first oscillator signal and the second oscillator signal.

17. The method of claim 16, wherein a frequency of one among the quadrature signal pair is equal to a frequency of the other among the quadrature signal pair.

18. The method of claim 17, wherein the frequency of the quadrature signal pair is one among the sum and the difference of the frequencies of the first and second oscillator signals.

19. The method of claim 16, wherein producing a quadrature signal pair includes producing a quadrature signal pair whose phase difference is robust to changes in at least one among the first and second oscillator signals.

20. The method of claim 16, wherein producing an output signal includes producing a shifted input signal pair having the same frequency as the input signal, wherein a phase difference between the shifted input signal pair is ninety degrees.

21. The method of claim 16, wherein producing an output signal includes:
   mixing the input signal with one among the quadrature signal pair to obtain a first mixed signal; and
   mixing the input signal with the other among the quadrature signal pair to obtain a second mixed signal.

22. The method of claim 21, wherein producing an output signal further includes performing a phase shift on at least one among the first and second mixed signals.

23. The method of claim 22, wherein performing a phase shift includes performing a phase shift having a magnitude of at least forty-five degrees.

24. The method of claim 21, wherein producing an output signal further includes:
   performing a phase shift on the first mixed signal to obtain a first phase-shifted signal; and
   performing a phase shift on the second mixed signal to obtain a second phase-shifted signal.

25. The method of claim 24, wherein the magnitude of a phase difference between the first phase-shifted signal and the second phase-shifted signal is ninety degrees.

26. The method of claim 24, wherein producing an output signal further includes combining the first phase-shifted signal and the second phase-shifted signal.

27. An integrated circuit for use in RE-to-If downconversion comprising;
    an image reject mixer configured and arranged to receive an input signal and a quadrature signal pair and to produce an output signal having a non-zero center frequency based on the input signal and the quadrature signal pair; and
    a quadrature signal generator configured and arranged to receive a first oscillator signal and a second oscillator signal and to produce the quadrature signal pair,
    wherein each of the quadrature signal pair is based on both the first oscillator signal and the second oscillator signal.

28. The integrated circuit according to claim 27, wherein the image reject mixer comprises:
    a first mixer configured and arranged to receive one among the quadrature signal pair and a signal based on the input signal and to output a first mixed signal; and
    a second mixer configured and arranged to receive the other among the quadrature signal pair and a signal based on the input signal and to output a second mixed signal,
    wherein the output signal is based on the first and second mixed signals.

29. A convener for use in RF-to_IF downconversion comprising:
    a generator configured and arranged to receive a first oscillator signal and a second oscillator signal and to output a quadrature signal pair having a frequency $\omega g$; and
    an image reject mixer configured and arranged to receive the quadrature signal pair and an input signal including an information signal modulated onto a carrier having a bandwidth centered at a frequency $\omega c$ and to output an output signal,
    wherein each of the quadrature signal pair is based on both of the first oscillator signal and the second oscillator signal, and
    wherein at least one among a sum and a difference of the frequencies of the first oscillator signal and the second oscillator signal is $\omega g$, and
    wherein the output signal includes the information signal modulated onto a carrier having a bandwidth centered at one among the frequencies ($\omega c - \omega g$) and ($\omega c + \omega g$), and
    wherein the image reject mixer is further configured and arranged to suppress a component in the input signal having the frequency ($2\omega g - \omega c$).

30. The convener according to claim 29, wherein the image reject mixer includes a mixer/phase shifter section, and wherein the mixer/phase shifter section receives the input signal and one of the quadrature signal pair and produces an output component signal, and wherein the output signal is based on the output component signal.

* * * * *

UNITED STATES PATENT AND TRADEMARK OFFICE
CERTIFICATE OF CORRECTION

PATENT NO. : 7,130,599 B2  Page 1 of 1
APPLICATION NO. : 09/798378
DATED : October 31, 2006
INVENTOR(S) : Charles J. Persico, James Jaffee and Steven C. Ciccarelli It is certified that error appears in the above-identified patent and that said Letters Patent is hereby corrected as shown below:

Title Page item 73
Assignee should read: QUALCOMM Incorporated

Col 7 line 44 should read: The converter according to claim 3, ....
Col 7 line 54 should read: The converter according to claim 3, ....
Col 7 line 60 should read: The converter according to claim 6, ....
Col 8 line 1 should read: The converter according to claim 2, ....
Col 8 line 4 should read: The converter according to claim 1, ....
Col 8 line 8 should read: The converter according to claim 1, ....
Col 8 line 16 should read: The converter according to claim 1, ....
Col 9 line 1 should read: A converter for use in RF-to-IF downconversion comprising: ....

Signed and Sealed this

Eighteenth Day of September, 2007

JON W. DUDAS
*Director of the United States Patent and Trademark Office*